(12) United States Patent
Emer et al.

(10) Patent No.: US 7,400,388 B2
(45) Date of Patent: Jul. 15, 2008

(54) METHOD FOR DETERMINING DISTORTION AND/OR IMAGE SURFACE

(75) Inventors: Wolfgang Emer, Aalen (DE); Uwe Schellhorn, Aalen (DE); Manfred Dahl, Lauchheim (DE); Rainer Hoch, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 286 days.

(21) Appl. No.: 11/138,430

(22) Filed: May 27, 2005

(65) Prior Publication Data

US 2006/0007429 A1    Jan. 12, 2006

Related U.S. Application Data

(60) Provisional application No. 60/574,583, filed on May 27, 2004.

(51) Int. Cl.
*G01J 1/00* (2006.01)

(52) U.S. Cl. .................. 356/124; 356/511; 356/512; 356/513; 356/514; 356/515; 356/125; 356/126; 356/127

(58) Field of Classification Search ......... 356/124–127, 356/511–515
See application file for complete search history.

(56) References Cited

U.S. PATENT DOCUMENTS 6,897,947 B1 * 5/2005 van der Laan et al. ...... 356/124

2002/0001088 A1    1/2002    Wegmann et al.

FOREIGN PATENT DOCUMENTS

| DE | 101 09 929 A1 | 11/2001 |
| WO | WO 99/27334 | * 11/1997 |
| WO | WO 01/63233 A2 | 8/2001 |

OTHER PUBLICATIONS

J. J. M. Braat, P. Dirksen, and A. J. E. M. Janssen, "Assessment of an extended Nijboer-Zernike approach for the computation of optical point-spread functions," J. Opt. Soc. Am. A 19, 858 (2002).*

(Continued)

*Primary Examiner*—Layla G. Lauchman
*Assistant Examiner*—Rebecca C Slomski
(74) *Attorney, Agent, or Firm*—Sughrue Mion, PLLC

(57) ABSTRACT

A method for determining at least one of distortion and defocus for an optical imaging system. The method includes determining wavefront aberrations in a pupil plane of the optical imaging system by a wavefront measurement method, determining focus offset measured values in an xy-direction and/or z-direction for one or more different illumination settings by a test pattern measurement method with imaging and comparative evaluation of test patterns for the optical imaging system, and determining values for one or more aberration parameters that relate to the distortion and/or image surface from a prescribed relationship between the determined wavefront aberrations and the determined focus offset measured values. By prescribing a relationship between the wave aberrations and the focus offset measured values, it is possible for the results of the wavefront measurement method and of the test pattern measurement method to be linked to one another so as to enable an improved precision in the determination of distortion and/or image surface.

10 Claims, 2 Drawing Sheets

OTHER PUBLICATIONS

R. Cubalchini, "Modal wave-front estimation from phase derivative measurements," J. Opt. Soc. Am. 69, 972-977 (1979).*

A. Guirao, D. R. Williams, and I. G. Cox, "Effect of rotation and translation on the expected benefit of an ideal method to correct the eyes higher-order aberrations," J. Opt. Soc. Am. A 18, 1003-1015 (2001).*

Nomura Hiroshi, "Measurement of Wave-Front Aberrations in Lithography Lenses with an Overlay Inspection Tool", Optical Review vol. 8, No. 4 pp. 227-234 (2001).*

Nigel R. Farrar et al., In-situ measurement of lens aberrations, Proceedings of SPIE, 2000. pp. 18-29, vol. 4000.

Hans van der Laan et al., Aerial image measurement methods for fast aberration set-up and illumination pupil verification, Proceedings of SPIE, 2001, pp. 394-407, vol. 4346.

* cited by examiner

METHOD FOR DETERMINING DISTORTION AND/OR IMAGE SURFACE

The following disclosure is based on U.S. Provisional Application No. 60/574,583 filed on May 27, 2004, which is hereby incorporated into this application by reference.

BACKGROUND OF THE INVENTION

1. Field of the Invention

The invention relates to a method for determining distortion and/or image surface for an optical imaging system.

2. Description of the Related Art

In order to describe aberrations of optical imaging systems, use is currently being made of the Zernike coefficients ($Z_2$ to $Z_{37}$), for the definition of which reference may be made to the literature. It is not important here as to whether the literature employs somewhat different definitions, that is to say all these definitions are to be viewed as covered by the invention. The Zernike coefficients $Z_2$ and $Z_3$ characterize an aberration denoted as distortion which describes a wavefront tilt in the pupil plane of the optical imaging system referred to an x-direction or y-direction of an orthogonal xyz coordinate system whose z-direction is parallel to the optical axis of the imaging system. The Zernike coefficient $Z_4$ characterizes an aberration denoted as image surface or defocus in the z-direction. Various methods are known for determining distortion and image surface.

In one of these known method types, a test pattern is imaged and evaluated by comparison, in order to determine an offset of the focal position relative to a nominal position. This offset depends in general on the illumination setting used when imaging and on the test pattern used. The distortion and the image surface are reconstructed from the focus offset measured values at several field points.

An optimization, following the measurement, of the imaging characteristics of the optical imaging system with reference to distortion and image surface is restricted in this pattern-dependent method type to the illumination setting used in imaging the test pattern. If other illumination settings are required in the imaging mode, the imaging system is possibly not in an optimally adapted state. A so-called MIS method has been proposed as remedy, in the case of which a plurality of test pattern measurements are carried out at different illumination settings and focus offset measured values dependent on the illumination setting are determined therefrom as described, for example, in Hans van der Laan et al., "Aerial image measurement methods for fast aberration set-up and illumination pupil verification", Proc. SPIE 4346 (2001), pages 394-407. However, the accuracy of the determination of distortion and image surface with the aid of this method is limited.

A second, pattern-independent method type is based on the direct measurement of the wavefront aberrations or Zernike coefficients, for example, by means of shearing interferometry methods as described in the laid-open patent publications WO 0163233 A2 and DE 101 09 929 A1, or by means of a Shack-Hartmann method as specified in N. R. Farrar et al., "In-situ measurement of lens aberrations", SPIE vol. 4000, page 18 (2000). In the case of such a determination of the distortion and/or the image surface, that is to say of $Z_{2/3}$ and/or $Z_4$, the accuracy of the wavefront measurement is mostly markedly dependent on the accuracy of the absolute calibration of the measurement system.

SUMMARY OF THE INVENTION

It is the object of the invention to provide a method for precisely determining distortion and/or image surface, independent of the illumination setting.

The invention solves this and other objects by the provision of a method which includes determining wavefront aberrations, or wave aberrations for short, in a pupil plane of the optical imaging system by a wavefront measurement method, determining focus offset measured values in an xy-direction and/or z-direction for one or more different illumination settings by a test pattern measurement method with imaging and comparative evaluation of test patterns for the optical imaging system, and determining values for one or more aberration parameters that relate to the distortion and/or image surface from a prescribed relationship between the determined wavefront aberrations and the determined focus offset measured values. By prescribing a relationship between the wave aberrations and the focus offset measured values, it is possible for the results of the wavefront measurement method and of the test pattern measurement method to be linked to one another so as to enable an improved precision in the determination of distortion and/or image surface.

In a refinement of the invention, the Zernike coefficients $Z_2$, $Z_3$ and $Z_4$ are used as the aberration parameter set with the aid of which the distortion/image surface aberrations are described.

In a development of the method, use is made for the prescribable relationship of a linear relationship between the determined focus offset measured values and the wave aberrations with weighting coefficients that are to be determined and are dependent on the illumination setting and the test pattern. For small aberrations such as are present in high-precision imaging systems, for example, in the case of high performance projection objectives of microlithography projection exposure systems, the linear relationship is valid with satisfactory accuracy and substantially simplifies the calculation. The weighting coefficients can be determined, for example, by theoretical, numerical simulations.

In a refinement of the method, focus offset measured values are respectively determined in the xy direction and/or z-direction for each of several illumination settings, and values for the aberration parameter set are calculated therefrom and from the wavefront aberrations determined. A weighted mean value is formed for the respective aberration parameter from these values in relation to different illumination settings. Use is made for the averaging of weighting factors with the aid of which it is possible to keep the propagation of errors from the measured data at a minimum. The measuring accuracy of the method can be raised by the formation of mean values.

A development of the method makes use for the test pattern measurement method of a single large illumination setting and an associated test pattern. With only one large illumination setting, which can, in particular, be incoherent or annular, and a comparatively small test pattern, the weighting coefficients for higher Zernike coefficients are usually very small. This permits a precise calculation of the aberration parameter or aberration parameters, that is to say of distortion and/or image surface, which essentially makes use of the focus offset measured data, while the aberration data exert a minimal influence on correction.

In a development of the method, the aberration parameter or aberration parameters are primarily determined from the focus offset measured data with the aid of a system of equations that links the focus offset with Zernike coefficients via a weighting matrix. In this variant method, the measured aberration data are used for an improved conditioning of the system of equations for the purpose of minimal error propagation.

In a refinement of the method, in the test pattern measurement method an aerial image is measured for the respective test pattern, or a pattern is produced in a radiation-sensitive layer and the pattern is evaluated. When projection objectives for microlithography are being measured, test patterns can be imaged, for example, on to a photoresist layer of a wafer, the resist patterns thus produced being compared with reference patterns.

In a development of the method, the wavefront measurement is carried out by means of a shearing interferometry method or a Shack-Hartmann method.

A refinement of the method is used to determine distortion and/or image surface on a projection objective for microlithography. An important aspect of microlithography, which is used to fabricate semiconductor wafer patterns and other finely-patterned components, is a highly precise imaging of mask patterns, which serve as object (reticle), on to a photosensitive substrate (wafer). Since different illumination settings are frequently used for wafer exposure, it is particularly advantageous here to characterize distortion and image surface independently of the illumination setting.

Advantageous exemplary embodiments of the invention are illustrated in the drawings and described below. In the drawings:

DETAILED DESCRIPTION OF THE INVENTION

Method variants according to the invention for a projection objection for microlithography as an optical imaging system under investigation, that is to say component under test, are described below by way of example. It goes without saying that the method is not restricted to the measurement of such objectives, but can be carried out on any other optical imaging systems.

Figure 1:
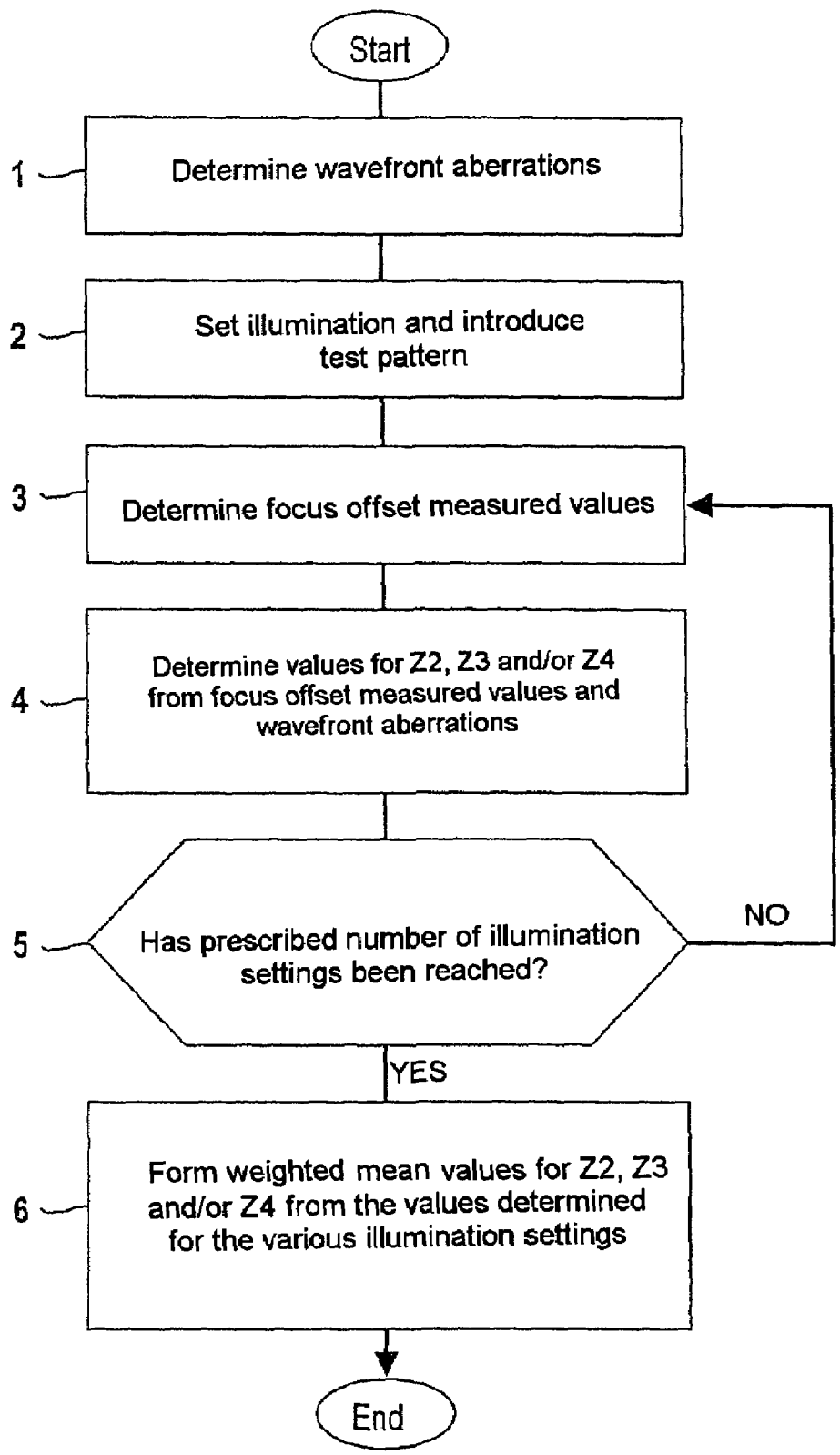
FIG. 1 shows a flowchart of a first variant of a method for determining distortion and/or image surface.

In a first method step 1 of a variant of the method shown in FIG. 1, wave aberrations are determined by carrying out a wavefront measurement at the projection objective by means of a shearing interferometry method known from the literature. In this type of method, a wavefront source with a coherence mask that bears a coherence pattern is arranged on the object side, that is to say in the beam path upstream of the component under test, and a periodic diffraction pattern, for example, a diffraction grating, is arranged on the image side, that is to say in the beam path downstream of the component under test. Stepwise, lateral displacement of the diffraction pattern in a respective periodicity direction enables the wavefront to be measured in a pupil plane of the component under test, and thus the wave aberrations to be determined.

This determination can be carried out independently of the illumination setting when it is ensured that each diffraction order produced by the coherence pattern illuminates the entire pupil. It is known that this condition can be fulfilled by an appropriate design of the apparatus for wavefront measurement.

The result of the wavefront measurement is then a set of values, independent of the illumination setting, for a selected set of aberration parameters, for which purpose the Zernike coefficients $Z_2$ to $Z_{37}$ are used below as one possibility. The distortion $Z_{2/3}$ and/or the image surface $Z_4$ can therefore be extracted in principle from these measurement results, although possibly not with the desired accuracy.

In a next method step 2, a selected illumination setting is set at an illumination system upstream of the projection objective. This can be, for example, an incoherent or annular illumination. Focus offset measured values that are a function of setting and pattern are determined in a following step 3 in the xy-direction and in the z-direction for a number of field points. Test patterns are arranged for this purpose on the object side of the projection objective, and imaged onto a photoresist layer on a wafer at which, after resist development, the resist patterns are then evaluated by comparison with reference patterns. As an alternative to imaging patterns into a resist layer, it is also possible to undertake an evaluation of the aerial image in a way that is likewise customary.

In a following step 4, the focus offset measured values determined in step 3 are linked with the wave aberrations determined in step 1 in order, independently of the illumination setting and the test patterns, to determine values for the Zernike coefficients $Z_2$, $Z_3$ and/or $Z_4$ that describe distortion and image surface of the projection objective.

This linkage is described below with the aid of the offset $dx^s$, measured for a given illumination setting s, of the focal position in the x-direction, and holds by analogy for the offset in the y-direction and in z-direction, referred in each case to a normal position of the focus. The following dependence of the focus offset $dx^s$ in the x-direction on the wave aberrations $Z_2$ to $Z_{37}$ is assumed for this purpose:

$$dx^s = \epsilon_n f x_n^s Z_n. \tag{a}$$

The focus offset measured value is therefore composed of a linear combination of the Zernike coefficients $Z_2$ to $Z_{37}$ with weighting coefficients $fx_n^s$ that depend on the illumination setting and the test patterns, summing being performed over the Zernike coefficients with the running index n, and the index s representing the illumination setting selected when imaging the test patterns.

On the basis of symmetry conditions, all the weighting coefficients $fx_n^s$ except for those that are assigned to asymmetric Zernike coefficients from $n \geq 7$, can be set equal to zero in order to determine the focus offset measured value $dx^s$ in the x-direction. In addition, in order to simplify the calculation, it is possible, starting from a specific order, for example, for n>23, likewise to set a portion of the asymmetric weighting coefficients equal to zero when a determination of measured values can be achieved with the desired accuracy even without taking account of these coefficients.

The following relationship is produced by solving the above equation (a) for the Zernike coefficient $Z_2$, which describes the distortion in the x-direction:

$$Z_2 = (dx^s - \Sigma_{n=2} f x_n^s Z_n)/fx_2. \tag{b}$$

The weighting coefficients $fx_n^s$ can be determined from theoretical, numerical simulations. For reasons of symmetry, the only effectively relevant Zernike coefficients are those with $n \geq 7$, which do not exhibit mirror symmetry with respect to the x-direction. They result from the wavefront measurement, and $dx^s$ is yielded by the focus offset measurement and so $Z_2$ can be determined from the above equation. The distortion $Z_3$ in the y-direction and the image surface $Z_4$ can be determined by analogy, the sum running over all the Zernike coefficients $n \geq 8$ not exhibiting mirror symmetry with respect to the y-direction, in the first case, and over all symmetrical Zernike coefficients $n \geq 9$ in the second case, since in both cases all remaining weighting coefficients are equal to zero for reasons of symmetry.

A comparatively precise determination of distortion and image surface can already be achieved with the aid of the abovedescribed method steps, it proving to be advantageous when the illumination setting selected for carrying out the imaging of the test patterns is annular or incoherent since, given these settings and the selection of a small pattern size for the test patterns used, the weighting coefficients $fx_n^s$, $fy_n^s$, $fz_n^s$ are relatively small.

If the accuracy of the measurement is to be raised further, additional focus offset measurements can be carried out with the aid of other illumination settings. A check is made in a step 5 as to whether a prescribed number of illumination settings has been reached. If this is not the case, one or more additional focus offset measurements are carried out with the aid of other illumination settings in accordance with steps 2 to 4 of the method. Once the prescribed number of illumination settings has been reached, a weighted mean value is formed for $Z_2$, $Z_3$ and $Z_4$, respectively, in a step 6 from the values for the Zernike coefficients $Z_2$, $Z_3$ and/or $Z_4$ that have been determined in the case of the respective illumination setting.

The following equation $$Z_2 = \Sigma_s \omega^s (dx^s - \Sigma_{n=2} fx_n^s Z_n)/fx_2 \quad (c)$$

with weights $\omega^s$, which satisfy the secondary condition $\Sigma_n \omega^s = 1$, is the starting point for determining this mean value for the distortion $Z_2$ in the x-direction. The index s runs over all the illumination settings used. The weighting coefficient $fx_2$ is independent of the illumination setting and of the test pattern, and the solution of the equation is exact, independent of the weighting, because what is involved is a weighted sum of the values of $Z_2$ determined for the individual settings s, in accordance with the above equation (b). Consequently, it is only the error propagation of the variables presented in equation c that is decisive for optimizing the weights $\omega^s$. Equation (c) can be recast as:

$$Z_2 = 1/fx_2 (\Sigma_n \omega^s \, dx^s - \Sigma_n Z_n \Sigma_s \omega^s fx_n^s).$$

Various methods are possible for optimizing the weights $\omega^s$ and their selection depends on the measurement techniques employed. One such method for determining the distortion in the x-direction is described briefly below.

It is assumed by way of simplification that the measuring errors of $dx^s$ are of the same magnitude for all the illumination settings and for all relevant Zernike coefficients. Assuming a Gaussian error propagation, the error in determining $Z_2$ depends on two terms specifically the error in the focus offset measurement, which is proportional to $\Sigma_s (\omega^s)^2$, and the error in the aberration measurement, which is proportional to $\Sigma_{n>2} (\Sigma_s \omega^s fx_n^s)^2$. A merit function M that is to be optimized can be set up from these two terms as follows:

$$M = \gamma \Sigma_{n>2} (\Sigma_s \omega^s fx_n^s)^2 + (1-\gamma) \Sigma_s (\omega^s)^2.$$

The parameter $\gamma$ regulates which of the two terms is more strongly optimized. The optimization of the function M is possible analytically by means of a linear least square method, that is to say, weighting factors $\omega^s$ are found which minimize M and satisfy the secondary condition $\Sigma \omega^s = 1$ at the same time. For $\gamma = 1$, a solution is obtained in which the aberration data exert minimum influence on the result of $Z_2$. The selection of $\gamma$ depends on the measurement uncertainty in the determination of focus offset and wave aberration, as well as on the sensitivities, values between $\gamma = 0.3$ and $\gamma = 0.8$, in particular, proving themselves in practice. A precise determination of $Z_2$, $Z_3$ and $Z_4$, and thus of the distortion and/or image surface, can be achieved by the optimization of the weights.

Figure 2:
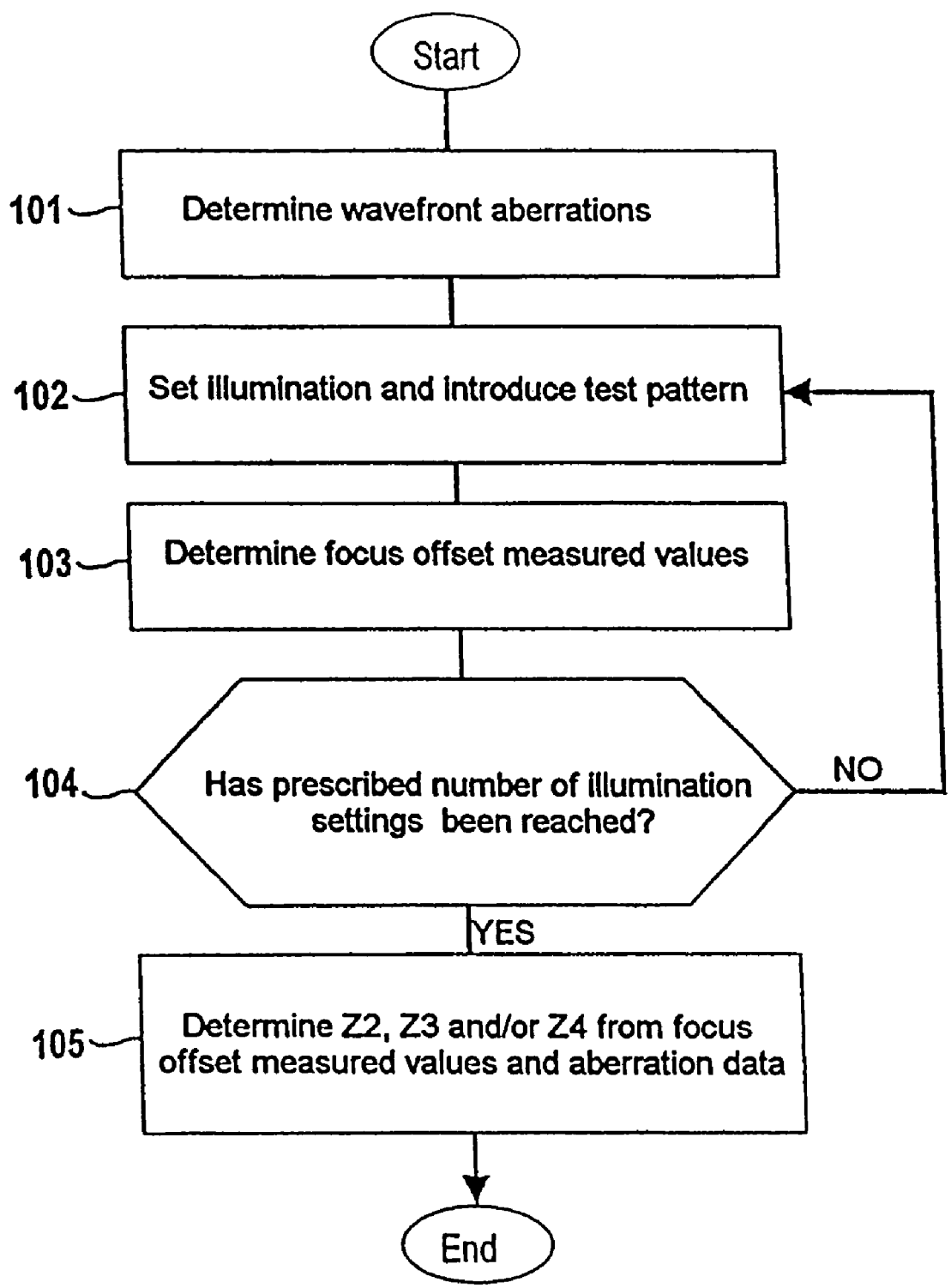
FIG. 2 shows a flowchart of a second variant of a method for determining distortion and/or image surface.

In an alternative method variant illustrated in FIG. 2, method steps 101 to 103 analogous to the method steps 1 to 3 of FIG. 1 are firstly carried out. A check is made in step 104 as to whether a prescribed number of illumination settings has been reached. Steps 102 and 103 are repeated if this is not the case. Of course, just as in the method of FIG. 1 it is likewise also possible in this variant of the method as an alternative not to carry out the wavefront measurement (step 101) until after the determination of the focus offset measured values.

A method step 105 is used to determine values for the Zernike coefficients $Z_2$, $Z_3$ and/or $Z_4$ from the focus offset measured values and the aberration data. Although it is the case that $Z_2$ can be determined per se without determining wavefront aberrations when the number of illumination settings s is greater than or equal to the number of Zernike coefficients n taken into account in the linear model according to equation a, but not with highest precision. A system of equations for determining $Z_2$ from the focus offset measured values can have the following form, for example:

$$dx^s = fx_2^s Z_2 + fx_7^s Z_7 + fx_{14}^s Z_{14} + fx_{23}^s Z_{23} \quad (d)$$

s running from 1 to 4, that is to say four illumination settings being set and four focus offset measured value sets $dx^s$ being determined. The number of the illumination settings employed is identical in this example to the number of the Zernike coefficients involved. The system of equations (d) can easily be solved exactly by inversion, and so the aberrations $Z_2$, $Z_7$, $Z_{14}$, $Z_{23}$ being sought can be determined directly. However, the errors in the focus offset measurement can have a very strong effect on the resulting $Z_2$ value.

Consequently, the measured wave aberrations are advantageously used for the improved determination of $Z_2$. By analogy with equation (a) or (d), the starting point for this purpose is a system of equations $dx^s = \Sigma_n fx_n^s Z_n$, written for short as $\underline{dx} = fx \cdot \underline{Z}$ in matrix notation, having a focus offset vector $\underline{dx} = (dx^1, dx^2 \ldots, dx^m)$, a Zernike vector $Z = (Z_2, \ldots)$, that includes the relevant Zernike coefficients, and a weighting matrix $(fx)_{ij} = fx_i^j$, with $j = 1, \ldots, m$ and the index i running over the number of relevant Zernike coefficients. A solution is possible as follows in the least square sense by means of determining a pseudoinverse $P_{inv}$ of the matrix fx:

$$\underline{Z} = P_{inv}(fx)\underline{dx}. \quad (e)$$

Here, the solution for $\underline{Z}$ corresponds to the solution that is obtained through optimizing the merit function M in the variant of the method of FIG. 1 when $\gamma = 1$ is set there. Particularly when there is poor conditioning of the system of equations, it is impossible to determine $Z_2$ with the desired accuracy. This problem can be circumvented when a threshold value T is introduced for calculating the pseudoinverse, and the conditioning of the system of equations is thereby improved. A new solution vector $\underline{Z}_{neu} = P_{inv}(fx,T)\underline{dx}$ is then determined, which constitutes a linear combination of Zernike coefficients that is related to the original vector via a matrix multiplication: $\underline{Z}_{neu} = E \cdot \underline{Z}$, with $E = P_{inv}(fx,T) \cdot fx$. A solution for $Z_2$ can be derived from this relationship by using wave aberration data for $n > 2$, which are denoted here as $Z_{aberr,n}$, specifically in accordance with the following equation:

$$Z_2 = (Z_{neu,2} - \Sigma_{n>2} E_{2,n} Z_{aberr,n})/E_{2,2},$$

$E_{2,n}$ denoting the coefficients of the first row of matrix E and $E_{2,2}$ being the first element of the first row. Of course, it is also possible to calculate distortion and/or image surface from the measured data while taking account of the wavefront aberrations in a way other than that described above.

It is clear in the case of both variants of the method shown that interaction between focus offset measurement and wavefront measurement has a particularly advantageous effect on high precision measurement of distortion and image surface.

Of course, it is also possible to use measurement methods other than those described here in order to carry out focus offset measurements and/or wavefront measurements. For example, the focus offset can also be measured by applying Moire measurement methods, while methods of the type of point diffraction interferometry, Twyman-Green interferometry or Fizeau interferometry, for example, can be applied for wavefront measurement.

The method described can be used to carry out optimization of a projection objective or of any other imaging systems with reference to a distortion and/or image surface determined very largely independently of the illumination setting and the patterns to be imaged.

The above description of the preferred embodiments has been given by way of example. From the disclosure given, those skilled in the art will understand the present invention and its attendant advantages, and also find apparent various modifications to the methods and structures disclosed. The applicant seeks to cover all such modifications as fall within the spirit and scope of the invention and equivalents thereof.

What is claimed is:

1. A method for determining at least one of distortion and image surface for an optical imaging system, comprising:
    determining wavefront aberrations in a pupil plane of the optical imaging system by a wavefront measurement method,
    determining focus offset measured values in at least one of an xy-direction and z-direction for one or more different illumination settings by a test pattern measurement method with imaging and comparative evaluation of test patterns for the optical imaging system, and
    determining values for at least one aberration parameter that relates to at least one of the distortion and the image surface from a prescribed relationship between the determined wavefront aberrations and the determined focus offset measured values.

2. The method as claimed in claim 1, wherein at least one of the Zernike coefficients Z2, Z3, and Z4 is used for the aberration parameter or aberration parameters.

3. The method as claimed in claim 1, wherein a linear relationship between the determined focus offset measured values and the wavefront aberrations with weighting coefficients that are to be determined and are dependent on the illumination setting and the test pattern is used for the prescribed relationship.

4. The method as claimed claim 1, wherein
    for each of several sets of illumination settings and test patterns focus offset measured values are determined in the at least one of the xy-direction and z-direction, and values for the aberration parameter or aberration parameters are calculated therefrom and from the wavefront aberrations determined, and
    a weighted mean value is formed for the aberration parameter or aberration parameters from the values calculated in relation to the various illumination settings by using weighting factors that minimize propagation of errors from the measured values.

5. The method as claimed in claim 1, wherein focus offset measured values in the at least one of the xy-direction and z-direction are determined for a single, large illumination setting and a test pattern of small structural size is determined, and values for the aberration parameter or the aberration parameters are calculated from these and from the wavefront aberrations determined.

6. The method as claimed in claim 5, wherein the single, large illumination setting comprises an incoherent or annular illumination setting.

7. The method as claimed in claim 1, wherein a system of equations that links the focus offset measured values with Zernike coefficients via a weighting matrix is used to determine the values of the aberration parameter or aberration parameters, and wherein the wavefront aberrations determined are taken into account for the improved conditioning of the system of equations for reduced error propagation.

8. The method as claimed in claim 1, wherein in the case of the test pattern measurement method an aerial image is measured for the respective test pattern, or a pattern is produced in a radiation-sensitive layer and the pattern produced is evaluated.

9. The method as claimed in claim 1, wherein the wavefront measurement is carried out by a shearing interferometry method or a Shack-Hartmann method.

10. The method as claimed in claim 1, used to determine distortion and/or image surface on a projection objective for microlithography.

* * * * *